(12) United States Patent
Sulyman et al.

(10) Patent No.: US 12,341,048 B2
(45) Date of Patent: Jun. 24, 2025

(54) POROUS PLUG FOR ELECTROSTATIC CHUCK GAS DELIVERY

(71) Applicant: Applied Materials, Inc., Santa Clara, CA (US)

(72) Inventors: Alexander Sulyman, San Francisco, CA (US); Xue Yang Chang, San Jose, CA (US); Anwar Husain, Pleasonton, CA (US); Timothy Joseph Franklin, Campbell, CA (US); Joseph F. Sommers, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 257 days.

(21) Appl. No.: 17/537,141

(22) Filed: Nov. 29, 2021

(65) Prior Publication Data
US 2023/0170241 A1    Jun. 1, 2023

(51) Int. Cl.
*H01J 37/32* (2006.01)
*H01L 21/683* (2006.01)

(52) U.S. Cl.
CPC ...... *H01L 21/6833* (2013.01); *H01J 37/3244* (2013.01); *H01J 37/32715* (2013.01)

(58) Field of Classification Search
CPC .......... H01L 21/6833; H01L 21/67109; H01L 21/67126; H01L 21/68785; H01J 37/3244; H01J 37/32715; H01J 37/32449
USPC ..................................... 118/728; 156/345.53
See application file for complete search history.

(56) References Cited

U.S. PATENT DOCUMENTS

| 5,720,818 | A  | * | 2/1998  | Donde     | C23C 16/4586 118/728 |
| 6,108,189 | A  | * | 8/2000  | Weldon    | C23C 16/4586 279/128 |
| 6,471,779 | B1 | * | 10/2002 | Nishio    | H01L 21/67017 118/724 |
| 6,490,145 | B1 | * | 12/2002 | Kholodenko | H01L 21/6833 361/234 |
| 6,500,299 | B1 | * | 12/2002 | Mett      | C23C 16/455 118/728 |
| 7,848,076 | B2 |   | 12/2010 | Narendranath et al. | |

(Continued)

FOREIGN PATENT DOCUMENTS

JP    2017-135351 A    8/2017

OTHER PUBLICATIONS

PCT International Search Report for PCT/US2022/049524, dated Mar. 20, 2023.

*Primary Examiner* — Rudy Zervigon
(74) *Attorney, Agent, or Firm* — Moser Taboada

(57) ABSTRACT

Porous plugs for gas delivery in substrate supports and substrate supports and substrate processing chambers incorporating same are provided herein. In some embodiments, a porous plug for use in a substrate support includes: a porous central passageway; and a solid outer shell bonded to and surrounding the porous central passageway such that there is no continuous gap between the porous central passageway and the solid outer shell along an entire length of the porous plug, wherein the solid outer shell includes sealing surfaces disposed on ends of the solid outer shell to facilitate forming a seal along the sealing surface and surrounding the porous central passageway. In some embodiments, one or more o-ring retaining grooves can be formed about the outer surface of the solid outer shell.

20 Claims, 3 Drawing Sheets

(56) References Cited

U.S. PATENT DOCUMENTS

| | | | |
|---|---|---|---|
| 8,108,981 B2 | 2/2012 | Lubomirsky et al. | |
| 9,165,813 B2* | 10/2015 | Kataigi | H01L 21/6833 |
| 9,202,736 B2 | 12/2015 | Narendrnath et al. | |
| 11,276,602 B2* | 3/2022 | Shiraishi | H01J 37/32724 |
| 11,715,652 B2* | 8/2023 | Ishikawa | C04B 35/111 |
| | | | 219/444.1 |
| 2001/0045262 A1* | 11/2001 | Gujer | C23C 16/4401 |
| | | | 118/728 |
| 2003/0010292 A1* | 1/2003 | Kholodenko | C23C 16/45568 |
| | | | 118/728 |
| 2005/0105243 A1* | 5/2005 | Lee | H01L 21/6833 |
| | | | 361/234 |
| 2007/0077683 A1* | 4/2007 | Cerio | C23C 14/046 |
| | | | 257/E21.586 |
| 2007/0091541 A1* | 4/2007 | Buchberger, Jr. | |
| | | | H01J 37/32724 |
| | | | 361/234 |
| 2009/0034148 A1* | 2/2009 | Lubomirsky | H02N 13/00 |
| | | | 361/234 |
| 2009/0086400 A1* | 4/2009 | Samir | H01L 21/6833 |
| | | | 361/234 |
| 2009/0086401 A1* | 4/2009 | Samir | H01L 21/6831 |
| | | | 361/234 |
| 2009/0230636 A1* | 9/2009 | Goto | H01L 21/6831 |
| | | | 279/128 |
| 2015/0126038 A1* | 5/2015 | Okita | H01L 21/6831 |
| | | | 438/715 |
| 2016/0276198 A1* | 9/2016 | Anada | H01L 21/6831 |
| 2017/0352568 A1* | 12/2017 | Cho | H01L 21/6831 |
| 2018/0019101 A1* | 1/2018 | Ahn | C25D 11/04 |
| 2018/0330926 A1* | 11/2018 | Boyd, Jr. | H01L 21/6831 |
| 2018/0358253 A1* | 12/2018 | Noh | H01J 37/32724 |
| 2019/0019714 A1 | 1/2019 | Kosakai et al. | |
| 2019/0287838 A1* | 9/2019 | Yamaguchi | H01L 21/6833 |
| 2019/0287839 A1* | 9/2019 | Yamaguchi | H01L 21/6833 |
| 2019/0287840 A1* | 9/2019 | Katayama | H01L 21/67109 |
| 2019/0371578 A1* | 12/2019 | Larosa | H01L 21/67109 |
| 2020/0105568 A1* | 4/2020 | Pilgrim | H01L 21/68757 |
| 2020/0135528 A1* | 4/2020 | Shiraishi | H01L 21/6838 |
| 2020/0135529 A1* | 4/2020 | Shiraishi | H01L 21/67109 |
| 2020/0279765 A1* | 9/2020 | Furukawa | H01L 21/68757 |
| 2020/0286767 A1* | 9/2020 | Shiraishi | H01L 21/6831 |
| 2020/0286768 A1* | 9/2020 | Shiraishi | H01L 21/6833 |
| 2020/0286769 A1* | 9/2020 | Shiraishi | H01L 21/68714 |
| 2020/0373184 A1* | 11/2020 | Prouty | H01L 21/67109 |
| 2021/0225619 A1* | 7/2021 | Suzuki | H01L 21/683 |
| 2022/0028719 A1 | 1/2022 | Takemori | |
| 2022/0148903 A1* | 5/2022 | Wang | C04B 41/009 |
| 2022/0223387 A1* | 7/2022 | Matyushkin | H01J 37/32055 |
| 2022/0254671 A1* | 8/2022 | Ishikawa | H01L 21/67103 |
| 2022/0258431 A1* | 8/2022 | Parkhe | H01L 21/68757 |
| 2023/0061208 A1* | 3/2023 | Sasaki | H01L 21/6833 |
| 2023/0068968 A1* | 3/2023 | Sasaki | H01J 37/32715 |
| 2023/0170241 A1* | 6/2023 | Sulyman | H01L 21/67109 |
| | | | 156/345.51 |
| 2023/0197502 A1* | 6/2023 | Inoue | H01L 21/68757 |
| | | | 279/128 |
| 2023/0207288 A1* | 6/2023 | Lee | H01J 37/32513 |
| | | | 156/345.48 |
| 2023/0207370 A1* | 6/2023 | Inoue | H01L 21/683 |
| | | | 257/703 |
| 2023/0223291 A1* | 7/2023 | Inoue | H01L 21/6875 |
| | | | 279/128 |
| 2023/0238224 A1* | 7/2023 | Inoue | H01L 21/6831 |
| | | | 279/128 |
| 2023/0241731 A1* | 8/2023 | Chadha | H01L 21/68757 |
| | | | 361/234 |
| 2023/0298861 A1* | 9/2023 | Inoue | H01L 21/67109 |
| | | | 279/128 |

* cited by examiner

POROUS PLUG FOR ELECTROSTATIC CHUCK GAS DELIVERY

FIELD

Embodiments of the present disclosure generally relate to substrate processing equipment, and more particularly to substrate supports having gas delivery in substrate processing equipment.

BACKGROUND

In the semiconductor industry, devices are fabricated by a number of manufacturing processes, such as etching and deposition, producing structures on an ever-decreasing size. Etching and deposition processes are performed on a substrate in a processing chamber having a substrate support, such as an electrostatic chuck. The inventors have observed that as voltages increase on high power electrostatic chucks, components of the electrostatic chuck, such as gas delivery components, become more vulnerable to arcing.

Accordingly, the inventors have provided improved porous plugs that can significantly reduce arcing.

SUMMARY

Porous plugs for gas delivery in substrate supports and substrate supports and substrate processing chambers incorporating same are provided herein. In some embodiments, a porous plug for use in a substrate support includes: a porous central passageway; and a solid outer shell bonded to and surrounding the porous central passageway such that there is no continuous gap between the porous central passageway and the solid outer shell along an entire length of the porous plug, wherein the solid outer shell includes sealing surfaces disposed on ends of the solid outer shell to facilitate forming a seal along the sealing surface and surrounding the porous central passageway. In some embodiments, one or more o-ring retaining grooves can be formed about the outer surface of the solid outer shell.

In some embodiments, a substrate support is provided and includes: a plurality of layers including a first electrode and a second electrode separated by an insulator plate; a backside gas channel formed through the plurality of layers, wherein the backside gas channel includes a plug opening formed at least in the insulator plate; a porous plug disposed in the plug opening, the porous plug having a porous central passageway aligned with the backside gas channel to facilitate flow of a backside gas therethrough and a solid outer shell bonded to and surrounding the porous central passageway such that there is no continuous gap between the porous central passageway and the solid outer shell along an entire length of the porous plug, wherein the solid outer shell includes sealing surfaces disposed on ends of the solid outer shell to facilitate forming a seal along the sealing surface and surrounding the porous central passageway; and an o-ring disposed between the sealing surfaces and ones of the plurality of layers adjacent to the plug opening.

In some embodiments, the porous plug in the substrate support is a first porous plug and the substrate support further includes: a second porous plug disposed in a second plug opening, the second porous plug aligned with the first porous plug and including a porous central passageway aligned with the backside gas channel to facilitate flow of a backside gas therethrough and a solid outer shell bonded to and surrounding the porous central passageway such that there is no continuous gap between the porous central passageway and the solid outer shell along an entire length of the second porous plug, wherein the solid outer shell includes sealing surfaces disposed on ends of the solid outer shell to facilitate forming a seal along the sealing surface and surrounding the porous central passageway; and an o-ring disposed between the sealing surfaces of the first and second porous plugs. In some embodiments, the substrate support can be an electrostatic chuck.

In some embodiments, a processing chamber is provided and includes: a chamber body and a lid which enclose an interior volume; a substrate support disposed in the interior volume; and a porous plug as described in any of the embodiments disclosed herein.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
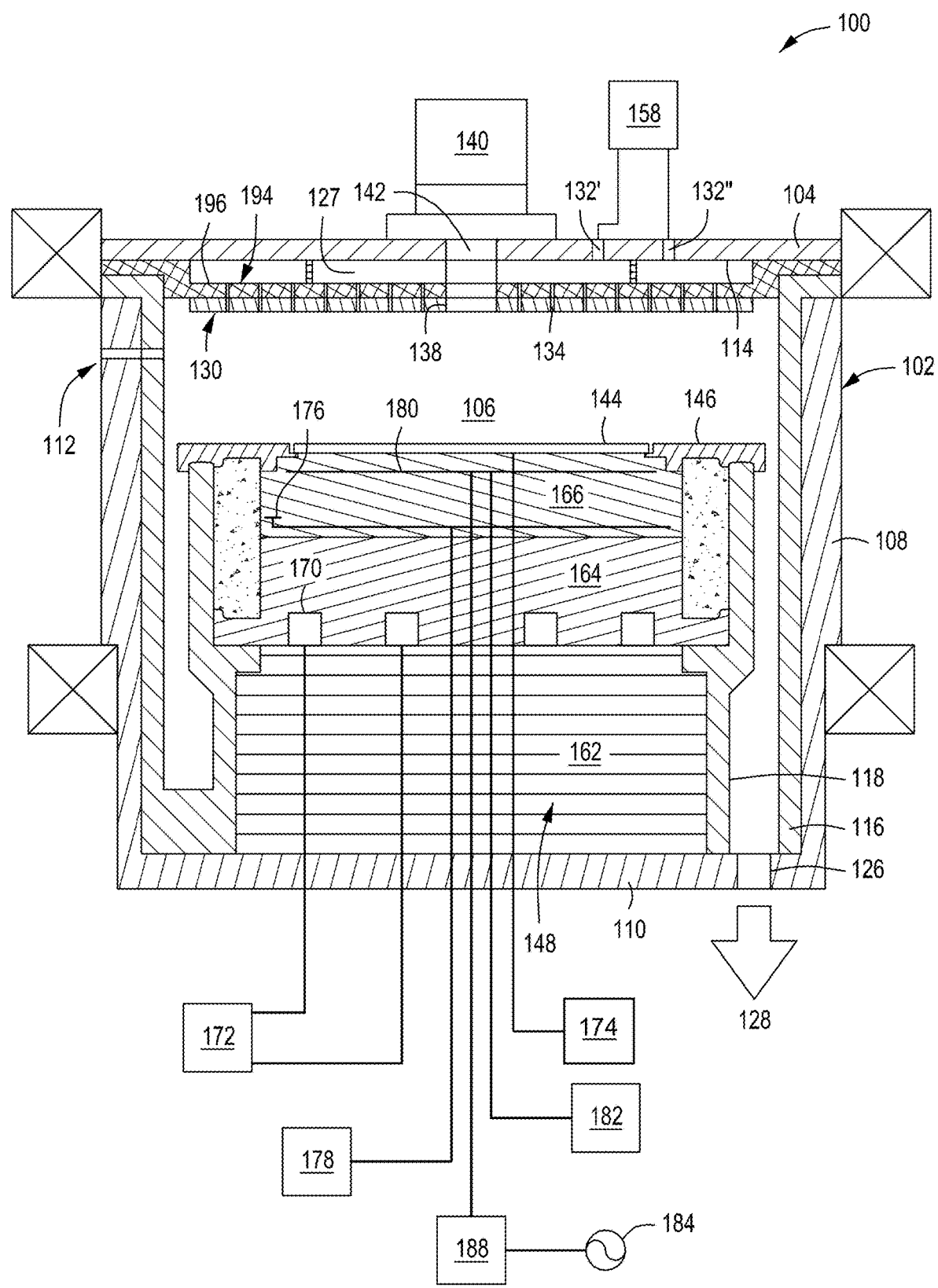
FIG. 1 is a sectional view of a semiconductor processing chamber having a plasma prevention apparatus in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of the disclosure generally relate to porous plugs and use of such porous plugs in substrate supports suitable to prevent or limit undesirable arcing during use in a processing chamber. The inventors have observed that the porous plug is particularly useful for processing in high plasma power regimes. For example, the inventors have observed that as voltages increase on high power electrostatic chucks, certain parts of the system become more vulnerable to arcing. Accordingly, the inventors have provided improved porous plugs for use in substrate supports which advantageously allow for backside gas delivery to a high voltage electrostatic chuck without any arcing or plasma light up along the path from high voltage to ground, thus enabling higher voltages to be applied to the electrostatic chuck without failure.

FIG. 1 is a sectional view of one embodiment of a semiconductor processing chamber 100 having a porous plug disposed in a substrate support in accordance with at least some embodiments of the present disclosure. The processing chamber 100 includes a chamber body 102 and a lid 104 which enclose an interior volume 106. The processing chamber 100 described in FIG. 1 is illustrative and not meant to be limiting of the disclosure, as the porous plug described herein can be used in many different substrate supports and/or processing chambers having other configurations where arcing in the substrate support is a concern.

The chamber body 102 is typically fabricated from aluminum, stainless steel, or other suitable material. The chamber body 102 generally includes a chamber wall (e.g., sidewalls 108) and a bottom 110 that at least partially define an interior volume 106 of the processing chamber 100. A substrate access port (not shown) is generally defined in the sidewall 108 and is selectively sealed by a slit valve to facilitate entry and egress of a substrate 144 from the processing chamber 100.

One or more liners may be disposed in the interior volume 106 of the chamber body 102. For example, an outer liner 116 may be positioned against or on the sidewalls 108 of the chamber body 102. The outer liner 116 may be fabricated from aluminum oxide and/or coated with a plasma or halogen-containing gas resistant material such as yttria, yttria alloy, or an oxide thereof such as $Y_2O_3$.

A window 112 may be formed in the processing chamber 100, for example, to facilitate process monitoring and control via optical emission spectroscopy (OES), or other techniques requiring viewing into the interior volume 106 of the processing chamber 100. For example, the window 112 can be formed through the sidewall 108 and the liner (e.g., outer liner 116). A stray plasma prevention apparatus may be disposed between the sidewall 108 and the outer liner 116 proximate the window 112 to prevent plasma light up therebetween.

An exhaust port 126 is defined in the chamber body 102 and couples the interior volume 106 to a pump system 128. The pump system 128 generally includes one or more pumps and throttle valves utilized to evacuate and regulate the pressure of the interior volume 106 of the processing chamber 100. In one embodiment, the pump system 128 maintains the pressure inside the interior volume 106.

The lid 104 is sealingly supported on the sidewall 108 of the chamber body 102. The lid 104 may be opened to allow excess to the interior volume 106 of the processing chamber 100. The lid 104 may optionally include a window 142 that facilitates optical process monitoring. In one embodiment, the window 142 is comprised of quartz or other suitable material which permits the transmission of a signal utilized by an optical monitoring system 140.

A gas panel 158 is coupled to the processing chamber 100 to provide process and/or cleaning gases to the interior volume 106. Examples of processing gases may include halogen-containing gas, such as $C_2F_6$, $SF_6$, $SiCl_4$, HBr, $NF_3$, $CF_4$, $Cl_2$, $CHF_3$, $CF_4$, and $SiF_4$, among others, and other gases such as $O_2$, or $N_2O$. Examples of carrier gases include $N_2$, He, Ar, other gases inert to the process and non-reactive gases. Inlet ports 132', and optionally 132", are provided in the lid 104 to allow gases to be delivered from the gas panel 158 to the interior volume 106 of the processing chamber 100 through the gas distribution assembly 130.

The gas distribution assembly 130 is coupled to an interior surface 114 of the lid 104. The gas distribution assembly 130 has a gas distribution plate 194. The gas distribution assembly 130 has a plenum 127 defined between the lid 104 and the gas distribution plate 194. The gas distribution plate 194 may be coupled to or have a conductive base plate 196. The conductive base plate 196 may serve as an RF electrode. The gas distribution plate 194 may be a flat disc having a plurality of apertures 134 formed in the lower surface of the gas distribution plate 194 facing toward the substrate 144. The gas distribution plate 194 may also have a portion 138 corresponding to the window 142. The portion 138 may be fabricated of similar materials as the window 142 to facilitate optical process monitoring. The apertures 134 allow the gases to flow from the inlet port 132 (shown as 132', 132") through the plenum 127 and out the apertures 134 into the interior volume 106 of the processing chamber 100 in a predefined distribution across the surface of the substrate 144 being processed in the processing chamber 100.

A substrate support assembly 148 is disposed in the interior volume 106 of the processing chamber 100 below the gas distribution assembly 130. The substrate support assembly 148 holds the substrate 144 during processing. An edge deposition ring 146 is sized to receive the substrate 144 thereon while protecting the substrate support assembly 148 from plasma and deposited material. An inner liner 118 may be coated on the periphery of the substrate support assembly 148. The inner liner 118 may be a halogen-containing gas resistant material which is substantially similar to material used for the outer liner 116. In one embodiment, the inner liner 118 may be fabricated from the same material as that of the outer liner 116.

In one embodiment, the substrate support assembly 148 includes a mounting plate 162, a base 164 and an electrostatic chuck 166. The mounting plate 162 is coupled to the bottom 110 of the chamber body 102 includes passages for routing utilities, such as fluids, power lines and sensor leads, among other, to the base 164 and the electrostatic chuck 166.

In some embodiments, at least one of the base 164 or the electrostatic chuck 166 may include at least one optional embedded heater 176 and a plurality of conduits 170 to control the lateral temperature profile of the substrate support assembly 148. The conduits 170 are fluidly coupled to a fluid source 172 that circulates a temperature regulating fluid therethrough. The heater 176 is regulated by a power source 178. The conduits 170 and heater 176 are utilized to control the temperature of the base 164, thus heating and/or cooling the electrostatic chuck 166.

The electrostatic chuck 166 comprises at least one clamping electrode 180 controlled using a chucking power source 182. In some embodiments, the electrode 180 may further be coupled to one or more RF power sources 184 through a matching circuit 188 for maintaining a plasma formed form process and/or other gases within the processing chamber 100. The RF power sources 184 are generally capable of producing an RF signal having a frequency from about 50 kHz to about 3 GHz and a power of up to about 10,000 watts. Gases entering the interior volume 106 may be energized by the RF electrode for maintaining a plasma in the interior volume 106 of the processing chamber 100. Although described as having one or more RF sources coupled to the electrostatic chuck 166, one or more RF sources may alternatively or additionally be coupled to the conductive base plate 196 or some other electrode disposed in or proximate the lid 104.

The substrate support assembly 148 further includes one or more channels extending through the substrate support assembly 148 to the support surface of the electrostatic chuck 166 to provide a backside gas, such as helium or the like, from a backside gas source 174 to the region between the backside of the substrate 144 and the support surface of the electrostatic chuck 166. The one or more channels extend between various layers of the substrate support assembly 148, including layers having differing electrical potential. The inventors have observed that arcing may occur between two electrodes having different potentials within the substrate support, such as between a powered electrode and a ground electrode.

Although substrate support assembly 148 is described above having an illustrative configuration, the porous plug described herein can more generally be provided in one or more locations along the backside gas channels to minimize or prevent arcing in the backside gas channel. The porous plug advantageously facilitates backside gas (e.g., helium) delivery to a high voltage substrate support (e.g., an electrostatic chuck) with reduced or no arcing or plasma light up along the path from high voltage to ground, thus advantageously enabling higher voltages to be applied to the substrate support without failure.

Figure 2:
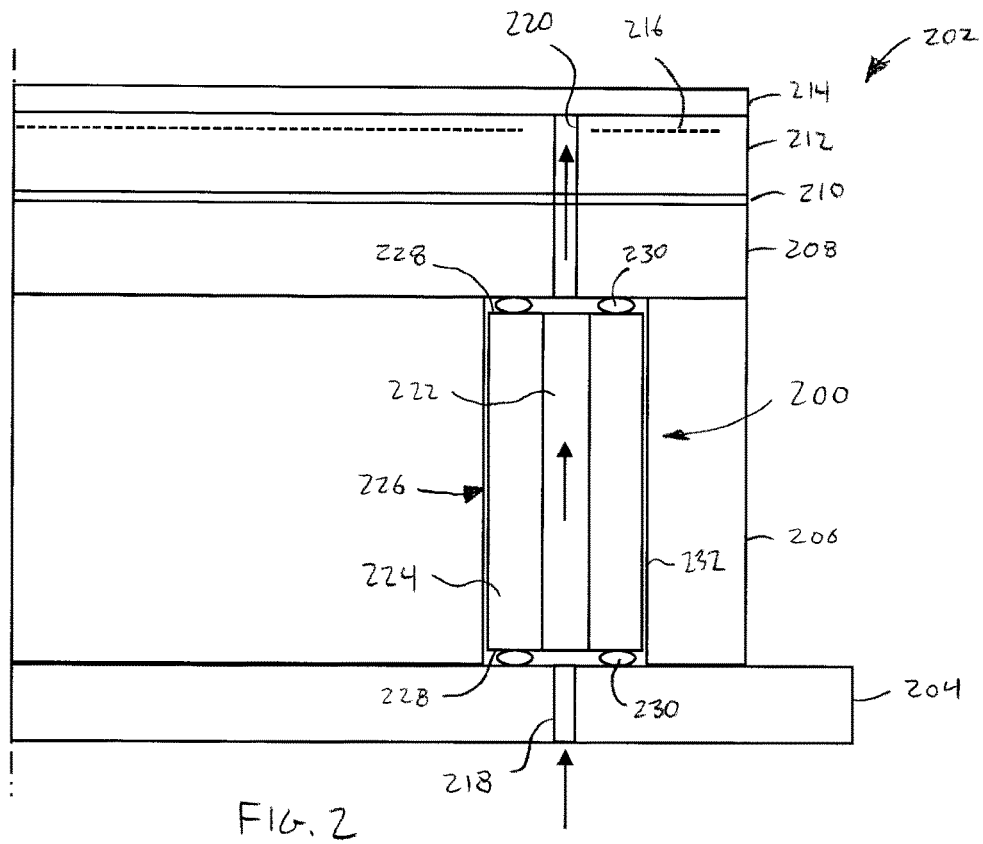
FIG. 2 is a partial schematic side view of an electrostatic chuck having a porous plug in accordance with at least some embodiments of the present disclosure.

For example, FIG. 2 is a partial schematic side view of a substrate support 202 having a porous plug 200 in accordance with at least some embodiments of the present disclosure. The substrate support 202 can be used as the substrate support assembly 148 described above with respect to FIG. 1. The substrate support 202 generally includes a stack of a plurality of layers, such as a ground plate 204 (e.g., a first electrode), an insulator plate 206 disposed atop the ground plate 204, a conductive baseplate 208 (e.g., a second electrode), disposed atop the insulator plate 206, and a dielectric layer 212 (e.g., an electrostatic chuck) disposed atop the insulator plate 206. The dielectric layer 212 can be bonded to the insulator plate 206 via a bond layer 210. The dielectric layer 212 includes one or more electrodes 216, such as a mesh electrode, disposed therein to facilitate electrostatically retaining a substrate 214 (e.g., a semiconductor wafer or the like) upon the substrate support 202 during processing within the processing chamber.

One or more backside gas conduits can be formed through the various layers of the substrate support 202 to facilitate providing a backside gas (e.g., from backside gas source 174 discussed with respect to FIG. 1) to the region between the backside of the substrate 214 and the support surface of the dielectric layer 212. For example, as depicted in FIG. 2, a backside gas conduit is formed by a channel 218 formed through the ground plate 204, a plug opening 232 formed through the insulator plate 206 to receive the porous plug 200, and a channel 220 formed through the baseplate 208, bonding layer 210, and dielectric layer 212. As indicated by the arrows in FIG. 2, backside gas can be provided through the substrate support 202 to the support surface of the dielectric layer 212. Although depicted as formed vertically through various layers of the substrate support 202, the backside gas conduits can alternatively or in combination have sections that extend laterally through one or more layers of the substrate support and/or can branch out from a single input to multiple outputs.

The porous plug 200 is disposed within the backside gas conduit, for example within the plug opening 232 formed through the insulator plate 206. The porous plug generally has the same shape as the plug opening 232. The plug opening 232 and the porous plug 200 can generally be any shape, and in some embodiments are cylindrical for ease of manufacturing and to minimize sharp corners.

The porous plug 200 includes a porous central passageway 222 and a solid, or non-porous, outer shell (solid outer shell 224). The porous central passageway 222 is bonded to the solid outer shell 224 such that there is no continuous gap therebetween along the entire length of the porous plug 200 (e.g., from top to bottom).

The porous central passageway 222 can be made of a suitable material such as a ceramic, for example aluminum oxide. The porous central passageway 222 can have a pore size ranging from about 5 μm to about 500 μm. However, smaller or larger pore sizes may be used for particular applications as needed. For example, at higher voltage applications than currently used, even smaller pore sizes may be useful. The porous central passageway 222 can generally be any shape, and in some embodiments is cylindrical. In some embodiments, the porous central passageway 222 has a diameter of about 1/16" to about 3/4".

The solid outer shell 224 can be made of a suitable material such as a ceramic, for example aluminum oxide. The solid outer shell 224 can generally be any shape, and in some embodiments is cylindrical. In some embodiments, the solid outer shell 224 has an outer diameter of about 1/4" to about 1".

The width of the porous plug 200 is sized such that a small gap 226 is defined between the outer surface of the porous plug 200 and the wall of the plug opening 232. In some embodiments, a distance across the gap 226 is about 1 to about 30 mils (0.001 to about 0.030 inches). The gap 226 advantageously facilitates insertion of the porous plug 200 within the plug opening 232 despite tolerances in either the porous plug 200 or the plug opening 232. The gap 226 further advantageously facilitates movement of the different components during heating and cooling cycles due to differing coefficients of thermal expansion, thus minimizing any incurred stresses in the components or misalignment of the backside gas flow path through the different layers of the substrate support 202.

The solid outer shell 224 further includes sealing surfaces 228 on both ends of the solid outer shell 224 to facilitate forming a seal with an o-ring or other gasket (e.g., o-rings 230 depicted in FIG. 2) that surrounds the porous central passageway 222. In some embodiments, the sealing surfaces 228 on the ends of the solid outer shell 224 have a surface roughness Ra of 16 microinches or less. The width of the sealing surfaces 228 can be sufficient to form a seal with an o-ring or other gasketing material provided against the surface when installed. In some embodiments, the sealing surfaces 228 have a width of about 3/32" to about 1/4". The gasket or o-ring can be any elastomeric material suitable for electrostatic chuck applications.

The inventors have observed that porous plugs without a solid outer shell 224 can fail at the low-pressure interface between the porous material and insulator plate, since a gap usually must be present for mechanical reasons (e.g., tolerances and thermal movement as discussed above). The porous plugs disclosed herein advantageously allow for there to be zero gap at the low-pressure interface between the porous material and solid insulator material surrounding the porous material by bonding the porous central passageway 222 to the solid outer shell 224.

Thus, providing a seal along the end of the solid outer shell 224 advantageously facilitates separating the low-pressure backside gas conduit (e.g., flowing through the porous central passageway 222) from the gap 226 which can be maintained at a higher pressure, such as atmospheric or near atmospheric. Maintaining the gap 226 at a higher pressure makes arcing and plasma light up less likely and further separates any particulate that may be formed from any arcing event from the gas conduit and potentially reaching the substrate 214 or the interior volume of the processing chamber. For example, any arc would be forced to travel at atmospheric pressure (e.g., around the solid outer shell 224) rather than at low pressure (e.g., through the porous central passageway 222).

The height of the solid outer shell 224 (and of the porous central passageway 222) can be determined based upon thermal expansion of the various layers of the substrate support 202 and gasket or o-ring compression. For example, the height can be selected to not exceed maximum compression of the o-rings 230 while maintaining a seal when the substrate support 202 expands due to heating. In some embodiments, the height of the solid outer shell 224 can be about ½" to about 5". The selected height will be dependent upon the configuration of the substrate support and the porous plug. In some embodiments, multiple porous plugs can be stacked within the same opening.

For example, as depicted in FIG. 2, a single porous plug 200 is provided in plug opening 232 formed in the insulator plate 206. An o-ring 230 is disposed between lower sealing surface 228 and the ground plate 204 and an o-ring 230 is disposed between upper sealing surface 228 and the baseplate 208.

Figure 3:
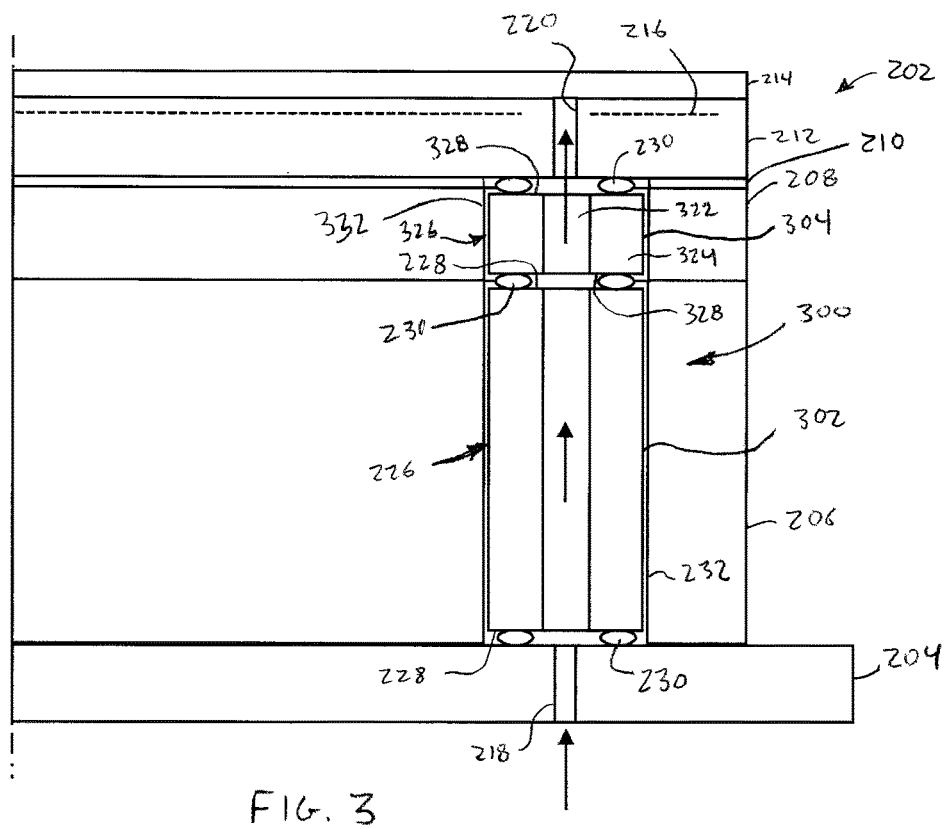
FIG. 3 is a partial schematic side view of an electrostatic chuck having a porous plug in accordance with at least some embodiments of the present disclosure.

However, as depicted in FIG. 3, a porous plug 300 is provided that is similar to the porous plug 200 except that a first plug 302 is provided along with a second plug 304. The first and second plugs 302, 304 are similar to the porous plug 200 except that the first plug is disposed in the plug opening 232 formed in the insulator plate 206 and the second plug 304 is disposed in a plug opening 332 formed in the baseplate 208. The first plug 302 is similar to the porous plug 200 discussed above. The second plug 304 is also similar to the porous plug 200 discussed above, having a porous central passageway 322, a solid outer shell 324, and sealing surfaces 328. The second plug 304 is sized to have a gap 326 similar to gap 226 discussed above. An additional o-ring 230 is provided between the first plug 302 and the second plug 304 the maintain a seal between the low-pressure region (porous central passageway 222 and porous central passageway 322) and the higher pressure region (gap 226 and gap 326).

Figure 4:
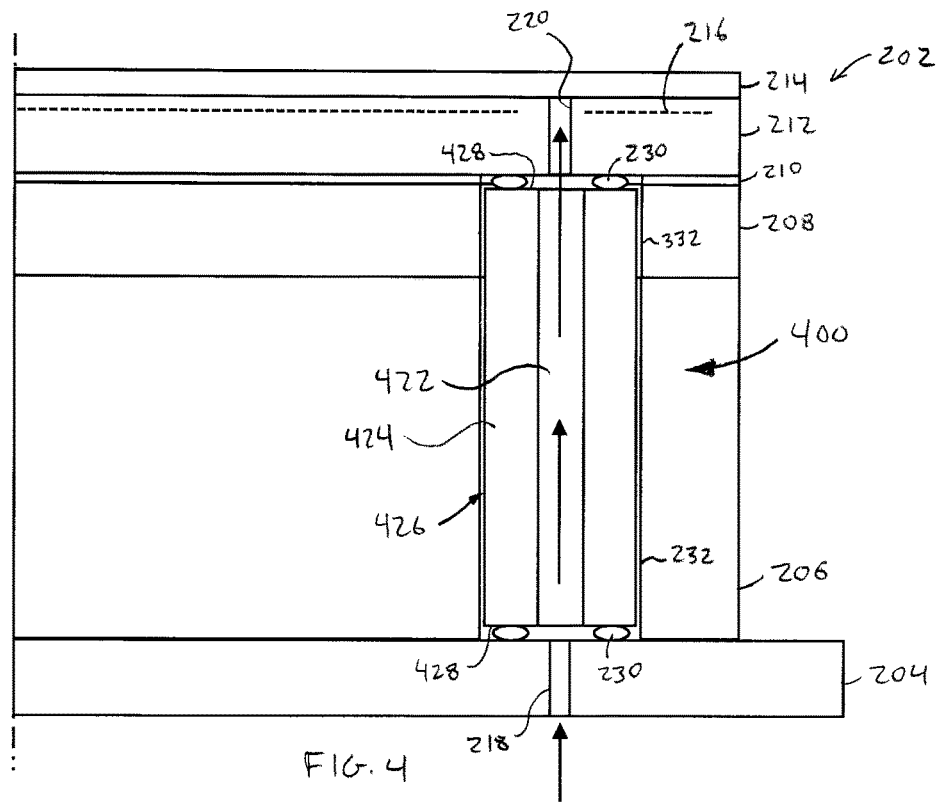
FIG. 4 is a partial schematic side view of an electrostatic chuck having a porous plug in accordance with at least some embodiments of the present disclosure.

Alternatively, and as depicted in FIG. 4, a porous plug 400 is provided that is similar to the porous plug 200 except that the length of the porous plug 400 is a single plug sized to fit within the plug openings 232, 332. The porous plug 400 is similar to the porous plug 200 discussed above, having a porous central passageway 422, a solid outer shell 424, and sealing surfaces 428. The porous plug 400 is sized to have a gap 426 similar to gaps 226, 326 discussed above.

In some embodiments, one or more additional gaskets or o-rings may be provided around the outer sidewall(s) of the porous plug. The additional one or more o-rings on the side of the porous plug facilitates the spacing and alignment of the porous plug within the plug opening, to advantageously maintain a more concentric fit and even gap around the porous plug. The additional one or more o-rings can also advantageously facilitate holding the porous plugs in place. The additional one or more o-rings can also advantageously facilitate further blocking line of sight along the gap to further limit or prevent arcing or plasma light up in the gap.

Figure 5A:
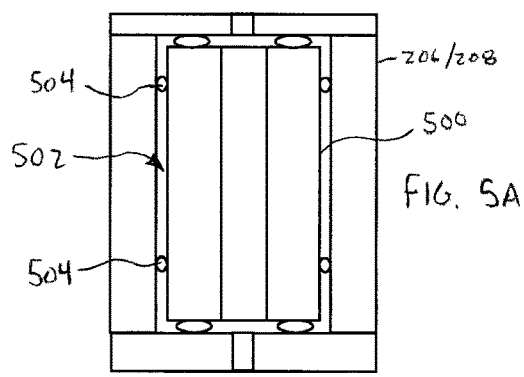
FIGS. 5A-5D respectively depict partial schematic side views of an electrostatic chuck having a porous plug in accordance with at least some embodiments of the present disclosure.
Figure 5B:
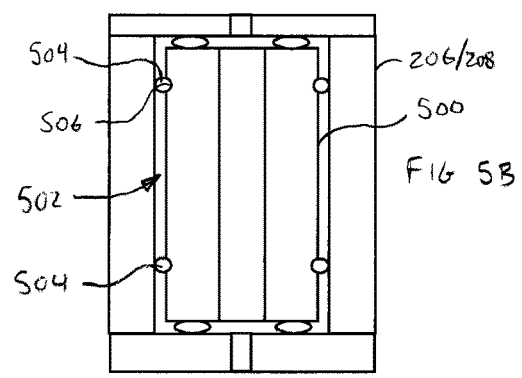
Figure 5C:
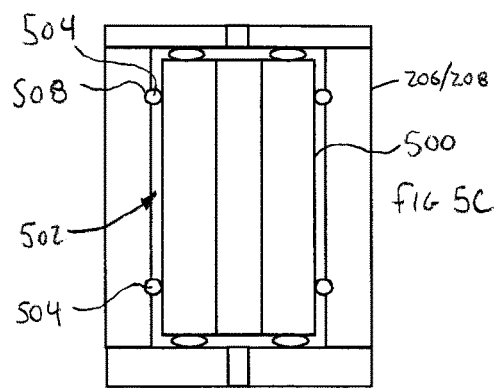
Figure 5D:
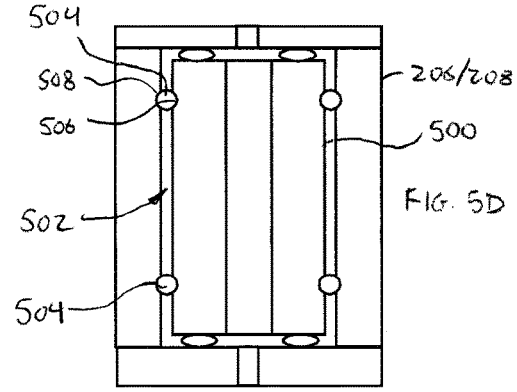

For example, FIGS. 5A-5D respectively depict partial schematic side views of an electrostatic chuck having a porous plug 500 with side o-rings in accordance with at least some embodiments of the present disclosure. The porous plug 500 can be any of the porous plugs 200, 300, 400 described above. The porous plug is disposed in a plug opening formed in one or more of the insulator plate 206 or the baseplate 208. As depicted in FIG. 5A, in some embodiments, one or more o-rings 504 (two shown in FIG. 5A) are provided around the porous plug 500 within the gap 502 (e.g., gap 226, 326, and/or 426). In some embodiments, and as shown in FIG. 5A, the o-rings can be merely placed around the outer surface of the porous plug 500 (e.g., around the solid outer shell 224, 324, and/or 424). In some embodiments, and as depicted in FIG. 5B, a retaining groove 506 can be formed about the outer surface of the porous plug 500 (e.g., around the solid outer shell 224, 324, and/or 424) to facilitate retention of the o-ring in a desired location. In some embodiments, and as depicted in FIG. 5C, a retaining groove 508 can be formed along the inner surface of the plug opening (e.g., plug opening 232 and/or 332) to facilitate retention of the o-ring in a desired location. In some embodiments, and as depicted in FIG. 5B, a retaining groove 506 can be formed about the outer surface of the porous plug 500 (e.g., around the solid outer shell 224, 324, and/or 424) to facilitate retention of the o-ring in a desired location. In some embodiments, and as depicted in FIG. 5D, retaining grooves 506 and 508 can both be provided to facilitate retention of the o-ring in a desired location.

The electrostatic chuck (e.g., dielectric layer 212) may also have separate porous plugs using the present design or using existing designs to further limit or prevent arcing due to voltage differences between the substrate 214 and the baseplate 208 or between the electrode 216 and the baseplate 208.

While the foregoing is directed to embodiments of the present disclosure, other and further embodiments of the disclosure may be devised without departing from the basic scope thereof.

The invention claimed is:

1. A porous plug for use in a substrate support, comprising:
a porous central passageway; and
a solid outer shell bonded to and surrounding the porous central passageway such that there is no continuous gap between the porous central passageway and the solid outer shell along an entire length of the porous plug, wherein the solid outer shell includes a sealing surface disposed on a top end of the solid outer shell proximate a first end of the porous central passageway, and on an opposing bottom end of the solid outer shell proximate an opposing second end of the porous central passageway, to facilitate forming a seal along the sealing surface and surrounding the porous central passageway.

2. The porous plug of claim 1, wherein the sealing surfaces have a surface roughness Ra of 16 microinches or less.

3. The porous plug of claim 1, wherein the porous central passageway is made of a ceramic material.

4. The porous plug of claim 3, wherein the solid outer shell is made of a ceramic material.

5. The porous plug of claim 1, wherein the solid outer shell is made of a ceramic material.

6. The porous plug of claim 1, wherein the porous central passageway has a diameter of about 1/16" to about 3/4".

7. The porous plug of claim 1, wherein the solid outer shell has an outer diameter of about 1/4" to about 1".

8. The porous plug of claim 1, wherein the sealing surfaces have a width of about 3/32" to about 1/4".

9. The porous plug of claim 1, further comprising one or more o-ring retaining grooves formed about an outer surface of the solid outer shell.

10. The porous plug of claim 1, wherein a height of the porous plug is about ½" to about 5".

11. A substrate support, comprising:
a plurality of layers including a first electrode and a second electrode separated by an insulator plate;
a backside gas channel formed through the plurality of layers, wherein the backside gas channel includes a plug opening formed at least in the insulator plate;
the porous plug of claim 1 disposed in the plug opening, wherein the porous central passageway is aligned with the backside gas channel to facilitate flow of a backside gas therethrough; and
an o-ring disposed between the sealing surfaces and ones of the plurality of layers adjacent to the plug opening.

12. The substrate support of claim 11, further comprising a gap defined between facing surfaces of the plug opening and the solid outer shell, wherein a distance measured across the gap is about 0.001 to about 0.030 inches.

13. The substrate support of claim 11, wherein the plurality of layers further comprises an electrostatic chuck comprising a dielectric layer bonded to the second electrode and having one or more electrodes disposed within the dielectric layer.

14. The substrate support of claim 11, wherein the porous plug is a first porous plug and further comprising:
a second porous plug disposed in a second plug opening, the second porous plug aligned with the first porous plug and including a porous central passageway aligned with the backside gas channel to facilitate flow of a backside gas therethrough and a solid outer shell bonded to and surrounding the porous central passageway such that there is no continuous gap between the porous central passageway and the solid outer shell along an entire length of the second porous plug, wherein the solid outer shell includes sealing surfaces disposed on ends of the solid outer shell to facilitate forming a seal along the sealing surface and surrounding the porous central passageway; and
an o-ring disposed between the sealing surfaces of the first and second porous plugs.

15. The substrate support of claim 14, wherein the second plug opening is disposed through the second electrode.

16. The substrate support of claim 11, wherein the plug opening is disposed though the insulator plate and the second electrode.

17. The substrate support of claim 11, further comprising:
one or more o-ring retaining grooves formed in one or more of an outer surface of the solid outer shell or sidewalls of the plug opening; and
an o-ring disposed in each of the one or more o-ring retaining grooves.

18. A processing chamber, comprising:
a chamber body and a lid which enclose an interior volume; and
a substrate support disposed in the interior volume, the substrate support comprising:
a plurality of layers including a first electrode and a second electrode separated by an insulator plate;
a backside gas channel formed through the plurality of layers, wherein the backside gas channel includes a plug opening formed at least in the insulator plate;
the porous plug of claim 1 disposed in the plug opening, wherein the porous central passageway is aligned with the backside gas channel to facilitate flow of a backside gas therethrough; and
an o-ring disposed between the sealing surfaces and ones of the plurality of layers adjacent to the plug opening.

19. The processing chamber of claim 18, wherein the porous plug is a first porous plug and further comprising:
a second porous plug disposed in a second plug opening, the second porous plug aligned with the first porous plug and including a porous central passageway aligned with the backside gas channel to facilitate flow of a backside gas therethrough and a solid outer shell bonded to and surrounding the porous central passageway such that there is no continuous gap between the porous central passageway and the solid outer shell along an entire length of the second porous plug, wherein the solid outer shell includes sealing surfaces disposed on ends of the solid outer shell to facilitate forming a seal along the sealing surface and surrounding the porous central passageway; and
an o-ring disposed between the sealing surfaces of the first and second porous plugs.

20. The processing chamber of claim 19, further comprising:
one or more o-ring retaining grooves formed in one or more of an outer surface of the solid outer shell or sidewalls of the plug opening; and
an o-ring disposed in each of the one or more o-ring retaining grooves.

* * * * *